PUSH-PULL EMITTER FOLLOWER CIRCUIT
Filed Dec. 17, 1964
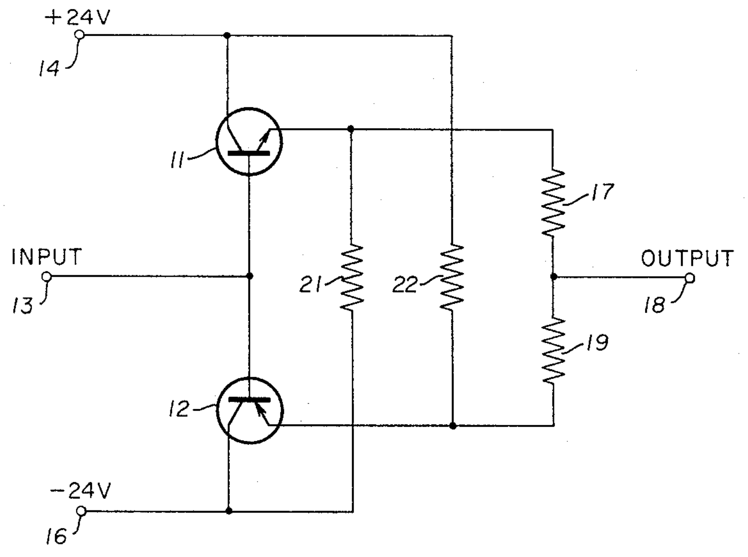
INVENTOR.
RONALD ZANE
BY
Roland A. Anderson (signature)
ATTORNEY.

3,381,234

PUSH-PULL EMITTER FOLLOWER CIRCUIT

Ronald Zane, Richmond, Calif., assignor to the United States of America as represented by the United States Atomic Energy Commission

Filed Dec. 17, 1964, Ser. No. 419,256

2 Claims. (Cl. 330—13)

ABSTRACT OF THE DISCLOSURE

An electronic signal amplifying circuit provides high output power with minimum power dissipation at the quiescent operating condition. In the circuit, two push-pull connected transistors, one an NPN type and the other a PNP type, are biased for class AB opertaion so that linearity is obtained through the quiescent point. The circuit is particularly suited for handling D.C. and low frequency signals as for servo systems.

This invention relates to electronic circuits utilizing transistors and more particularly to a circuit for linearly amplifying input signals while dissipating minimum power, particularly at the quiescent point. The invention described herein was made in the course, or under, Contract W–7405–ENG–48 with the United States Atomic Energy Commission.

The circuit of the present invention is particularly well adapted for use in servo control systems wherein the apparatus may be balanced for a large portion of the operating time. Thus, for a large proportion of the time the circuit is at the quiescent condition wherein no input signals are applied. The circuit of the present invention consumes minimum power supply energy under such condition and is therefore very efficient.

In addition to the low power consumption, the present invention provides very linear amplitude response over the operating range, thus the circuit is also very well adapted for use in analog computers and in high quality audio amplifiers.

The circuit of the present invention utilizes two transistors of complementary types, that is, one an NPN type and the other a PNP type. The transistors are operated in a push-pull emitter circuit wherein the power load is shifted from the NPN transistor for positive signal excursions to the PNP transistor for negative signal swings. Both transistors are biased for class AB type operation.

It is an object of the present invention to provide a push-pull circuit dissipating minimum power at the quiescent point.

It is another object of the present invention to provide a push-pull output circuit which can operate directly from a single ended input source circuit.

It is another object of the present invention to provide a push-pull circuit having linear amplitude response throughout the operating range.

It is another object to provide a new circuit operative from a low input impedance source and having a lower output impedance.

It is another object of the present invention to provide a push-pull circuit which may be operated without transformer coupling.

The invention will be better understood by reference to the accompanying drawing which is a circuit diagram of the invention.

Referring now to the drawing, there is shown an NPN transistor 11 having a base connected to the base of a PNP transistor 12. Input signals to the circuit are applied at an input termnial 13 which is connected directly to the bases of the transistors 11 and 12.

As an example, specific power supply voltage values, resistance values and transistor types will be described although it should be observed that other combinations of values and types can be adapted for use in the invention.

The collector of the NPN transistor 11 is connected directly to a positive twenty-four volt power supply terminal 14 while the collector of the PNP transistor 12 is connected directly to a negative twenty-four volt power supply terminal 16. The emitter of the NPN transistor 11 is connected through a ten ohm output resistor 17 to an output terminal 18. Similarly, the emitter of the PNP transistor is connected through a ten ohm output resistor 19 to the output terminal 18. The emitter of the NPN transistor 11 is also coupled through a first 510 ohm emitter follower resistor 21 to the negative power supply terminal 16. Likewise, the emitter of the PNP transistor is connected through a second 510 ohm emitter follower resistor 22 to the positive voltage power supply terminal 14.

In the operation of the circuit, at the quiescent point a zero signal input level is applied at the input terminal 13 to provide zero output voltage at the output terminal 18. The emitter to collector impedance of the two transistors 11 and 12 are approximately equal so that the voltage drops across the emitter resistors 21 and 22 are equal, thus the voltage at the output terminal 18 is midway between the power supply potentials and equal to the zero input voltage. However, a positive potential applied at the input terminal 13 lowers the impedance of the NPN transistor 11 and raises the impedance of the PNP transistor 12, thus causing the voltage drop across the first emitter follower resistor 21 to increase over the quiescent value while the voltage drop across the second emitter follower resistor 22 is decreased. Therefore, the voltage at output terminal 18 is caused to be more positive. A negative voltage applied at the input terminal 13 causes a negative potential to appear at the output terminal 18. Thus, there is no phase shift in the circuit.

In the specific circuit for which the resistance values have been given above, the NPN transistor 11 is a type 2N2338 and the PNP transistor 12 is a type 2N1906. The values of emitter follower resistors 21 and 22 and output resistors 17 and 19 are chosen to meet the condition wherein the sum of the voltage drops across output resistors 17 and 19 is equal to or slightly greater than the sum of the emitter-base voltage drops of transistors 11 and 12.

For best operation, it is preferred that either the small-signal, short-circuit forward-current transfer ratio ($h_{fe}$) be equal in the two transistors or that the input impedance be low (that is, 100 ohms or less). Such low impedance is necessary since the input impedance for negative swings is approximately $h_{fe}$ for NPN transistor 11 times the resistance of first output resistor 17, while for positive voltage swings the input impedance is approximately $h_{fe}$ for PNP transistor 12 times the resistance of second output resistor 19. A simple means for providing a low source impedance is to cascade a low power push-pull emitter follower at the input, the low power emitter follower being identical to the higher power emitter follower of FIGURE 1 but with differing component values. The lower power input circuit has been built wherein the NPN transistor 11 is a type 2N2218, the PNP transistor 12 is a 2N2904, the emitter follower resistors 21 and 22 have a resistance of 3000 ohms and the resistance of the output resistors 17 and 19 is 100 ohms. Such low power emitter follower circuit has a higher input impedance than the higher power emitter follower.

Thus while the invention has been disclosed with respect to an exemplary embodiment, it will be apparent to those skilled in the art that numerous variations and modifications may be made within the spirit and scope of the invention and it is not intended to limit the invention except as defined in the following claims.

What is claimed is:

1. In an emitter follower circuit for amplifying an input signal potential which is variable around a median level, the combination comprising an NPN transistor having a base receiving said input signal and having an emitter and a collector, a PNP transistor having a base receiving said input signal and having an emitter and a collector, said PNP transistor and said NPN transistor having substantially equal small-signal, short-circuit forward-current transfer ratios, a power supply having a relatively positive potential terminal with respect to said level connected to the collector of said NPN transistor, said power supply means having a negative potential terminal with respect to said level connected to the collector of said PNP transistor, an output terminal, a first output resistor connected from said output terminal to the emitter of said NPN transistor, a second output resistor connected from said output terminal to the emitter of said PNP transistor, a first emitter follower resistor connected from said positive potential terminal to the emitter of said PNP transistor and to the end of said second output resistor remote from said output terminal, and a second emitter follower resistor connected from said negative potential terminal to the emitter of said NPN transistor and to the end of said first output resistor remote from said output terminal.

2. An emitter follower circuit as defined in claim 1, wherein said output resistors have a resistance value oi a magnitude giving a voltage drop sum at least equal to the sum of the emitter-base voltage drops of said transistors.

References Cited

UNITED STATES PATENTS

| | | | |
|---|---|---|---|
| 2,955,257 | 10/1960 | Lindsay | 330—13 |
| 3,281,703 | 10/1966 | Bladen | 330—15 X |

ROY LAKE, *Primary Examiner.*

E. C. FOLSOM, *Assistant Examiner.*